METHOD OF MAKING A HIGH FREQUENCY TRANSISTOR STRUCTURE

Filed Nov. 9, 1965 3 Sheets-Sheet 1

Inventors:
Robert N. Hall,
Jerome J. Tiemann,
by Marvin Snyder
Their Attorney.

Inventors:
Robert N. Hall,
Jerome J. Tiemann,
by Marvin Snyder
Their Attorney.

July 29, 1969 R. N. HALL ETAL 3,457,631

METHOD OF MAKING A HIGH FREQUENCY TRANSISTOR STRUCTURE

Filed Nov. 9, 1965 3 Sheets-Sheet 3

Inventors:
Robert N. Hall,
Jerome J. Tiemann,
by Marvin Snyder
Their Attorney.

3,457,631

METHOD OF MAKING A HIGH FREQUENCY TRANSISTOR STRUCTURE

Robert N. Hall, Schenectady, and Jerome J. Tiemann, Burnt Hills, N.Y., assignors to General Electric Company, a corporation of New York Filed Nov. 9, 1965, Ser. No. 506,982
Int. Cl. B01j *17/00;* H01l *5/00*
U.S. Cl. 29—578 4 Claims

ABSTRACT OF THE DISCLOSURE

A high frequency planar transistor having a very thin base layer to minimize charge carrier transit time and storage effects, in which effective base sheet resistance is lowered by contacting the base through a plurality of minute contacts. The emitter, being much thicker and more heavily doped than the base region, has a very low sheet resistance. The collector-base junction is produced by forming a diffused base region, and dopants diffused into the base region through unprotected portions of the outer surface of the base region form an emitter region and an emitter-base junction. Exposed segments of the base region at this outer surface are then selectively etched to a depth less than the emitter region depth, exposed surfaces of the emitter region are coated with insulation, and the etched base region surfaces are contacted by depositing metal over the coated emitter region surfaces.

This invention relates to transistors, and more particularly to planar transistors having low sheet resistances and a method of making such transistors.

High frequency transistors require thin base layers which consequently have a high sheet resistance; that is, resistance measured in a lateral direction through the layer. Since the signal is greatly attenuated when it travels edgewise through the base layer for more than a very small distance, it has heretofore been necessary to keep the emitter and base contacts quite close together. Thus, the upper frequency limits of transistor designs have heretofore been determined by a compromise between base layer thickness and ability to place emitter and base connections close together, with the latter limitation depending upon the degree of resolution attainable by masking techniques or by the ability to reregister a sequence of masks employed in diffusion methods of transistor fabrication.

The present invention contemplates a transistor structure wherein the entire area of the base layer is contacted by the base electrode through a plurality of minute contacts so as to make active the entire base layer. Due to the greater thickness of the emitter region, which is also more heavily doped than the base region, emitter sheet resistance, or resistance measured in a lateral direction through the emitter layer, is very low, permitting the signal to propagate much farther in the lateral direction through the emitter layer than the base layer. This results in operation at much higher frequencies than otherwise obtainable from a transistor having the same areal dimensions of contact between emitter and base regions.

Although the interpenetrating base and emitter regions of the transistor structure herein described provide greatly improved high frequency operation, the invention also contemplates a process capable of mass-producing such structure with a high degree of uniformity. The process involves straightforward application of planar techniques without requiring very high resolution masking or difficult re-registration of two masks.

Accordingly, one object of this invention is to provide a high frequency planar transistor structure and a method of fabricating said structure.

Another object is to provide a transistor having interpenetrating, diffused base and emitter regions and a method of producing such regions by use of planar techniques.

Another object is to provide an inexpensive method of fabricating a transistor having a plurality of contacts between the base electrode and the base layer.

Described briefly, the noval transistor structure comprises a monocrystalline wafer of semiconductive material having unitary collector, base and emitter regions therein. The collector region is of one conductivity type, the base region is of opposite conductivity type adjacent the collector region, and the emitter region is of the one conductivity type and in interpenetrating contact with the base region. The top surface of the emitter region is coated with insulation and a unitary conductor is applied to the top surfaces of the insulation and the base region so as to contact only the base region at each exposed surface thereof surrounded by at least a portion of the emitter region. An emitter electrode is applied to a marginal area of the emitter region and a collector electrode is connected to a surface of the collector region.

The method of fabricating the high frequency transistor comprises, in one aspect, the steps of diffusing a first impurity into a semiconductor wafer of one conductivity type through one surface of the wafer to form a continuous region of opposite conductivity type extending to a predetermined depth below the one surface, thereby locating the collector junction of the transistor. A plurality of spots are then masked on the one surface of the wafer, and a second impurity is diffused into the portion of the opposite conductivity type region of the wafer unshielded by the spots through the one surface thereof, thereby forming a junction which defines the boundary of the second region of the one conductivity type at a depth of slightly less than the predetermined depth, in order to determine the emitter junction. The spots are then unmasked to reveal a surface of the one conductivity type interspaced with zones of the opposite conductivity type which are interiorly interconnected through the base layer located between the emitter and collector junctions. The zones of opposite conductivity type are next selectively etched at the one surface to a depth less than the maximum diffused depth of the second impurity. The surface of the second region is then coated with insulating material. The coating operation is preferably performed by rotating the wafer about an axis normal to the plane of the wafer while simultaneously evaporating insulating material onto the surface of the second region from a source displaced from the axis by a distance sufficiently large to cause the second region to shield substantially the entire surface of each etched zone from the evaporated insulating material. A metal is then applied over the one surface of the wafer to form a continuous metallic conductor in contact with the region of opposite conductivity type at the etched zones, and a metal electrode is connected to the outer portion of the second region.

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

Figures 1, 2, 3, 4, 5, 6, 7, 8, 9, 10:
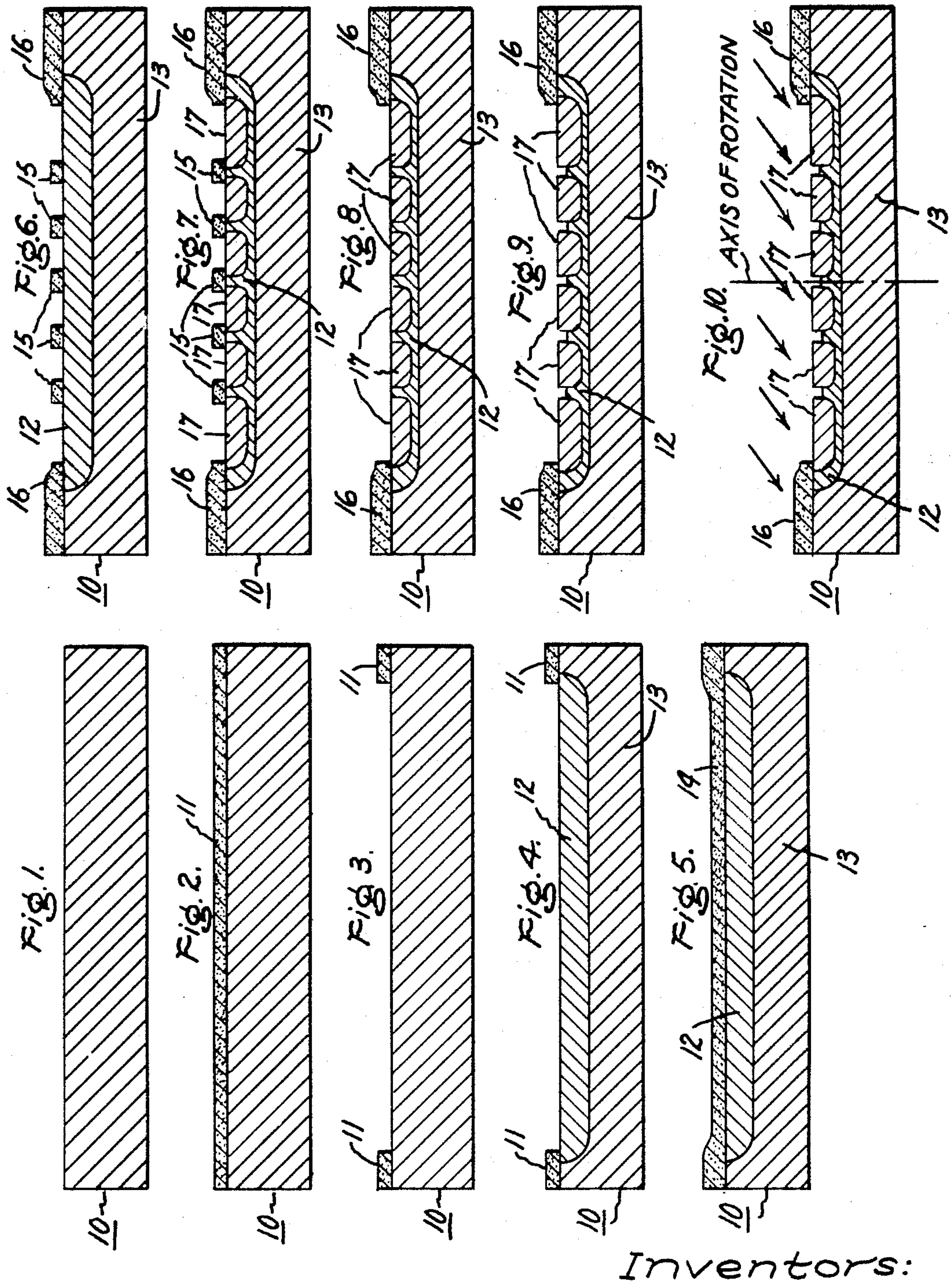
FIGURES 1–14 are cross-sectional views of a transistor in successive stages of manufacture in accordance with the present invention.

In the drawings, FIGURE 1 is a cross-sectional view of of a wafer of monocrystalline semiconductive material of a predetermined conductivity type. For illustrative purposes, wafer 10 is assumed to the N-type silicon; that is, silicon doped with a donor impurity, such as phosphorus.

In FIGURE 2, a coating of silicon oxide 11 is shown on the upper surface of wafer 10. This coating is formed, for example, by heating the wafer to a temperature of 1100° C. in an oxygen atmosphere. Other methods of producing oxide coating 11 on the upper surface of wafer 10 may also be employed.

FIGURE 3 illustrates wafer 10 after all but a continuous marginal area of silicon oxide coating 11 has been removed. This removal may be accomplished by any of several methods well known in the art, such as by use of photoresist techniques. Photoresist techniques are fully described in Photosensitive Resists for Industry, published by Eastman Kodak Company, 1962.

An acceptor impurity is next diffused into the N-type semiconductive wafer through the aperture formed by the remnant marginal portion of oxide layer 11, as illustrated in FIGURE 3, to form a P-type region 12 and an adjacent N-type region 13, having a configuration as illustrated in FIGURE 4. This is accomplished by heating wafer 10 in an atmosphere containing the acceptor impurity, such as boron, so as to diffuse a sufficient quantity of impurity into the wafer to change the conductivity of region 12 from N-type to P-type. Duration of diffusion and temperature at which diffusion is performed varies with the material and desired depth of diffusion. For silicon, the temperature may be approximately 1100° C. and the diffusion period may range from one half hour to several hours. This results in the configuration of FIGURE 4. Alternatively, region 12 may be formed by other methods well known in the art, such as epitaxial deposition on the surface of wafer 10.

A new layer of oxide 14, such as silicon oxide, is next formed on wafer 10 of FIGURE 5 in a fashion similar to that described for layer 11 in FIGURE 2. This layer covers and merges with the remnant margin of layer 11, as well as the upper surface of the wafer. Thereafter, oxide layer 14 is etched by the well-known photoresist process, leaving, as shown in FIGURE 6, a residual pattern of oxide spots 15 arrayed in rows and columns on the upper surface of wafer 10, surrounded by a margin 16 of oxide which overlaps a portion of P-type region 12. These spots can be made much smaller and placed much closer together than structures associated with conventional transistors because there is no need to subsequently reregister the spots with another mask.

A donor impurity is next diffused into P-type region 12 of wafer 10 through the portion of the upper surface of the wafer left unmasked by oxide segments 15 and 16. For silicon, the donor impurity may be phosphorus diffused into wafer 10 at a temperature of approximately 1100° C. for a period of one half to several hours. The resultant interpenetrating structure, illustrated in FIGURE 7, comprises a unitary N-type region 17 with projections of P-type region 12 extending into apertures of region 17 left by the masking effect of oxide spots 15 upon the donor impurity diffusion. Oxide spots 15 are next removed by etching with hydrofluoric acid, resulting in the structure shown in FIGURE 8.

Figures 11, 12, 13, 14, 15:
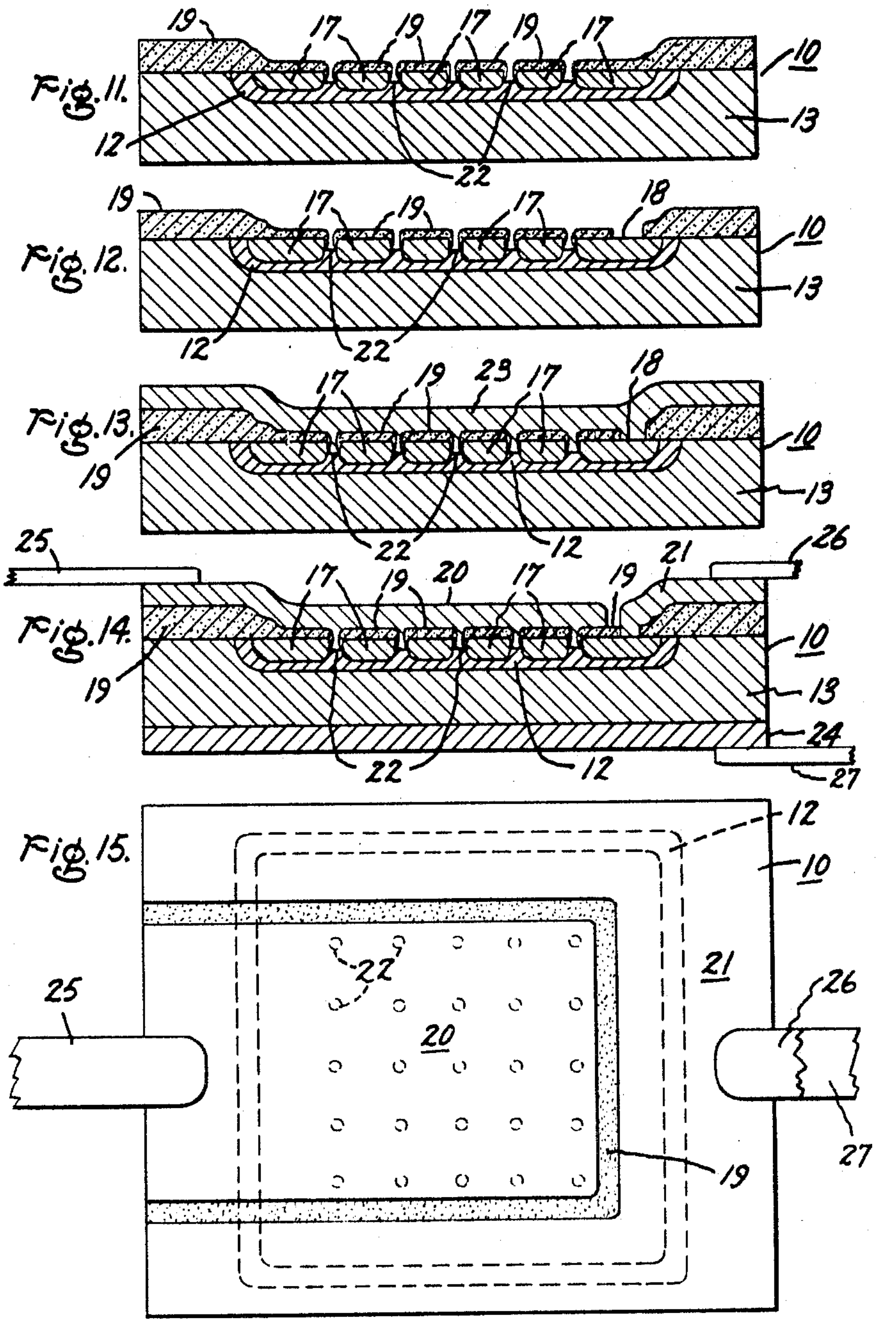
FIGURE 15 is a top view of the finished transistor.

A selective etching solution comprising, for example, an electrolytic etch using 2 percent sodium hydroxide is next applied to the upper surface of wafer 10, and a positive current of 10 milliamperes per square centimeter is passed from the sample to the solution for sufficient time to selectively etch the P-type material to a desired depth which is less than the maximum depth of the diffused donor impurity below the upper surface of the wafer, resulting in the structural configuration illustrated in FIGURE 9. The wafer is then rotated about an axis of rotation substantially perpendicular to the plane of the wafer, within a vacuum environment. Within this environment a source of silicon oxide, or other convenient insulator, displaced from the axis of rotation, is evaporated onto the upper surface of the structure in a direction indicated by the arrows shown in FIGURE 10. The source of silicon oxide is displaced from the axis of rotation by a distance sufficiently large to enable the raised N-type region 17 to shield the etched zones 22 of P-type region 12 from the evaporated silicon oxide, yet not so large as to prevent the sides of the raised portions of N-type region 17 from acquiring a coat of silicon oxide. Rotation of the wafer assures even distribution of the silicon oxide coating over the entire exposed surface of N-type region 17. The resultant structure, after sufficient time to coat N-type region 17 has elapsed, is illustrated in FIGURE 11. It can be seen that etched zones 22 of P-type region 12 remain exposed, while the upper surface of N-type region 17 is insulated by silicon oxide coating 19. To obtain this condition, it is desirable to select the diameter of oxide mask spots 15 to be such that the diameters of the etched zones at the wafer surface correspond to the depth of etching. Thus, the angle of evaporation, which is the angle between any arrow indicated in FIGURE 10 and the plane of the wafer, will be in the range of 30° to 60°, typically about 45°, and a well-defined boundary will be formed between exposed and insulated surfaces, as shown in FIGURE 11.

A strip of oxide coating 19 overlying the marginal portion of N-type region 17 is next removed by photoresist techniques, leaving an exposed surface 18 of region 17, as illustrated in FIGURE 12. A metal layer 23, such as aluminum, is then evaporated, sputtered or otherwise adheringly applied over the entire upper surface of the structure of FIGURE 12. This layer, illustrated in FIGURE 13, is etched by an aqueous solution containing 25 percent ammonium persulfate and one percent hydrofluoric acid for a period of about 30 seconds, by use of photoresist techniques, in a region above N-type region 17 adjacent exposed surface 18, so that it divides into two separate electrically isolated electrodes 20 and 21. Electrode 20 comprises the base electrode for the resultant transistor, inasmuch as it makes direct contact with P-type region 12 which constitutes the transistor base. Coating 19 prevents base electrode 20 from becoming short-circuited to N-type region 17 which constitutes the transistor emitter.

In the transistor configuration illustrated in FIGURE 14, contact with emitter layer 17 is made by aluminum electrode 21, which is in contact with exposed marginal area 18 of emitter 17. Base and emitter connectors 25 and 26 may be conveniently attached to the wide peripheral regions or "pads" of electrodes 20 and 21, respectively, by, for example, welding or thermocompression bonding. Contact to the collector region 13 of the transistor may be made by gold-soldering a metal electrode 24, such as Kovar, onto the bottom or perimetrical surface of wafer 10. A collector lead 27 is attached to electrode 24 by welding, for example.

FIGURE 15 is a top view of the transistor of FIGURE 14, showing the approximate spacing of etched zones 22 of base 12 in contact with electrode 20. Although the transistor is illustrated as being of rectangular configuration, the process involves no inherent limitation on the shape of the transistor; any convenient shape may be fabricated in accordance with the principles disclosed herein, without significantly affecting performance of the transistor.

Although the preceding process has been described in terms of fabricating a single transistor, a plurality of transistors may be produced contemporaneously by starting with a wafer of sufficiently large area, forming a plurality of transistors therewith as a unit, and cutting the resulting structure into a plurality of structures such as are illustrated in FIGURES 14 and 15.

Operation of the transistor herein described is especially advantageous at high frequencies, since base electrode 20 makes contact with base layer 12 at a plurality of interfaces 22 dispersed transversely throughout the base layer. Thus, the transistor is produced with a very thin base layer to minimize charge carrier transit time and storage effects, and with a much thicker and more heavily doped emitter. In devices constructed by prior art techniques, the base layer, if made this thin, would be too thin for good high frequency design, due to its high sheet resistance. However, because base layer 12 is provided with projections or "fingers" which extend through insulated apertures in the emitter layer to contact base electrode 20 at interfaces 22, electrical signals applied to the base electrode spread substantially uniformly over the portion of the base layer underlying the base electrode area. Therefore, this entire portion of the base layer is active, and because the sheet resistance of the base involves a plurality of short, parallel paths originating at each of interfaces 22, the effective sheet resistance of the base is quite low. Since the emitter region is much thicker and more heavily doped than the base region, its sheet resistance is very low, permitting signals to propagate quite far in the edgewise direction through the emitter layer. Consequently, higher frequencies can be obtained for the same dimensions of emitter and base contact regions than have heretofore been possible.

Figure 16:
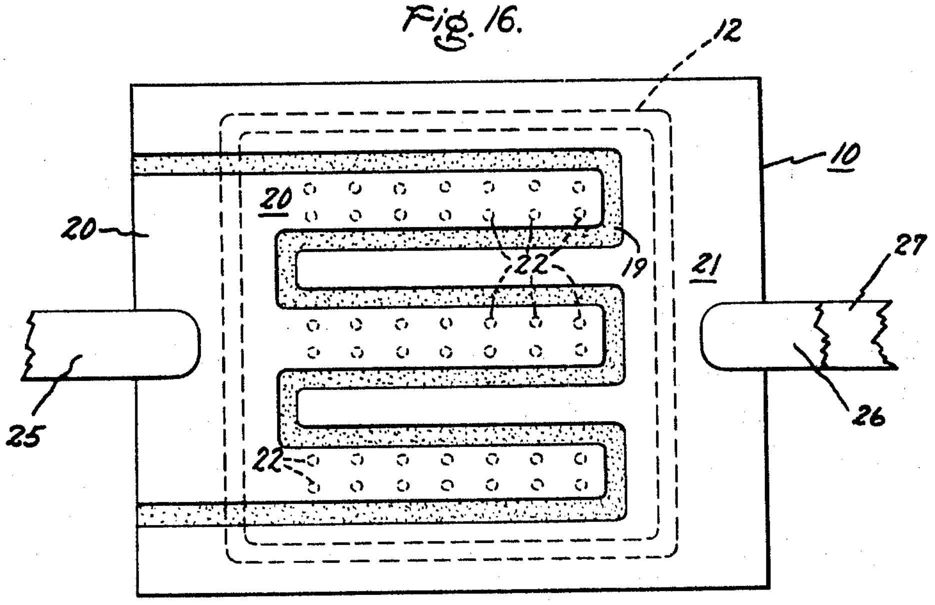
FIGURE 16 is a top view of a modification of a transistor constructed in accordance with the invention.

FIGURE 16 illustrates a modification of the transistor configuration shown in FIGURE 15, for use in high frequency applications at higher power than can be withstood by the transistor configuration of FIGURE 15. The higher power capability is achieved by interdigitating, within the plane of the transistors, the emitter region with the interpenetrating base and emitter regions, and by isolatedly interdigitating emitter electrode 21 with base electrode 20, accordingly. This is accomplished by depositing a specific residual pattern of oxide spots 15 on the upper surface of wafer 10, in the manner described in conjunction with FIGURE 6. Subsequent steps are carried out as hereinbefore described, except that electrode 23, shown in FIGURE 13, is etched in a pattern corresponding to the specific residual pattern of oxide spots 15. Thus, the emitter electrode surface area is increased so that the emitter electrode resistance is decreased, resulting in increased power capability of the transistor due to increased current-carrying capability of the emitter. Here also the problem of mask reregistration is greatly simplified since the metalization mask used in etching electrode 23 need only be aligned with respect to the entire region containing the array of base contacts.

The foregoing is a description of high frequency transistor structures having interpenetrating diffused base and emitter regions, and a method of uniformly fabricating such structures by use of planar techniques without requiring very high resolution masking or difficult mask reregistration steps. No attempt has been made to illustrate the transistor to scale, since, to illustrate principles of construction and operation, exaggeration of the scale has been necessary.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What we claim as new and desire to secure by Letters Patent of the United States is:

1. The method of fabricating a high frequency transistor comprising the steps of:

diffusing a first impurity into a semiconductor wafer of one conductivity type through one surface of said wafer to form a continuous region of opposite conductivity type extending to a predetermined depth below said one surface;

diffusing a second impurity into portions of the opposite conductivity type region to form a second region of the one conductivity type extending to less than said predetermined depth below said one surface;

selectively etching the zones of opposite conductivity type at said one surface to a depth less than the maximum diffused depth of said second impurity;

coating a majority of the surface of said second region with insulating material, applying a metal over said one surface of the wafer to form a continuous metallic conductor in contact with the region of opposite conductivity type at said etched zones and with said second region at the uncoated surface portion thereof; and etching said conductor so as to electrically isolate the portion of conductor in contact with the region of opposite conductivity type from the portion in contact with said second region.

2. The method of fabricating a high frequency transistor of claim 1 wherein said step of diffusing a second impurity into portions of the opposite conductivity type region comprises:

masking a plurality of spots on said one surface of the wafer;

diffusing a second impurity into the portion of the opposite conductivity type region of said wafer unshielded by spot masks through said one surface of the wafer to form a second region of the one conductivity type extending to less than said predetermined depth below said one surface; and removing said spot masks to reveal a surface of the one conductivity type interspersed with zones of the opposite conductive type.

3. The method of fabricating a high frequency transistor of claim 1, wherein said coating step comprises:

rotating said wafer about an axis substantially normal to the plane of said wafer; and evaporating said insulating material during wafer rotation onto the surface of said second region from a source displaced from said axis by a distance sufficiently large to cause the second region to shield substantially the entire surface of each etched zone of opposite conductivity type from the evaporated insulating material.

4. The method of fabricating a high frequency transistor of claim 3 wherein said step of diffusing a second impurity into portions of the opposite conductivity type region comprises:

masking a plurality of spots on said one surface of the wafer;

diffusing a second impurity into the portion of the opposite conductivity type region of said wafer unshielded by said spot masks through said one surface of the wafer to form a second region of the one conductivity type extending to less than said predetermined depth below said one surface; and removing said spot masks to reveal a surface of the one conductivity type interspersed with zones of the opposite conductivity type.

References Cited

UNITED STATES PATENTS

| | | | |
|---|---|---|---|
| 2,858,489 | 10/1958 | Henkels | 29—578 X |
| 2,981,877 | 4/1961 | Noyce. | |
| 3,025,589 | 3/1962 | Hoerni | 29—578 |
| 3,280,391 | 10/1966 | Bittman et al. | 29—580 X |
| 3,309,585 | 3/1967 | Forrest | 317—234 |

JOHN F. CAMPBELL, Primary Examiner

PAUL M. COHEN, Assistant Examiner

U.S. Cl. X.R.

29—579, 580, 589; 317—235